(12) United States Patent
Ting et al.

(10) Patent No.: US 9,239,270 B2
(45) Date of Patent: Jan. 19, 2016

(54) PIEZOELETRIC SENSING ELEMENT AND TORQUE SENSOR ASSEMBLED WITH THE SAME

(71) Applicant: CHUNG-YUAN CHRISTIAN UNIVERSITY, Tao Yuan County (TW)

(72) Inventors: Yung Ting, Tao Yuan County (TW); Sheuan-Perng Lin, Tao Yuan County (TW)

(73) Assignee: CHUNG-YUAN CHRISTIAN UNIVERSITY, Tao Yuan County (TW)

( * ) Notice: Subject to any disclaimer, the term of this patent is extended or adjusted under 35 U.S.C. 154(b) by 170 days.

(21) Appl. No.: 14/223,342

(22) Filed: Mar. 24, 2014

(65) Prior Publication Data
US 2014/0202261 A1 Jul. 24, 2014

Related U.S. Application Data

(62) Division of application No. 13/078,507, filed on Apr. 1, 2011, now Pat. No. 8,720,024.

(30) Foreign Application Priority Data

Apr. 2, 2010 (TW) .................................. 099110388

(51) Int. Cl.
| | |
|---|---|
| *G01B 7/16* | (2006.01) |
| *G01L 3/14* | (2006.01) |
| *G01L 3/10* | (2006.01) |
| *H01L 41/083* | (2006.01) |
| *H01L 41/113* | (2006.01) |

(Continued)

(52) U.S. Cl.
CPC ................. *G01L 3/1492* (2013.01); *G01L 3/10* (2013.01); *H01L 41/0833* (2013.01); *H01L 41/1132* (2013.01); *H01L 41/187* (2013.01); *G01L 1/16* (2013.01); *G01P 15/0922* (2013.01); *Y10T 29/42* (2015.01); *Y10T 29/49005* (2015.01); *Y10T 29/49155* (2015.01)

(58) Field of Classification Search
CPC ..... H01L 41/1132; H01L 41/187; G01L 1/16; G01L 1/162; G01P 15/0922
USPC .......................... 73/760, 777, 862.325, 862.68
See application file for complete search history.

(56) References Cited

U.S. PATENT DOCUMENTS

| | | | | |
|---|---|---|---|---|
| 4,695,988 | A | * | 9/1987 | Banno .................... G01V 1/208 310/800 |
| 5,814,922 | A | | 9/1998 | Uchino et al. |

(Continued)

FOREIGN PATENT DOCUMENTS

JP          02281769 A     11/1990

*Primary Examiner* — Max Noori
(74) *Attorney, Agent, or Firm* — Muncy, Geissler, Olds & Lowe, P.C.

(57) ABSTRACT

A piezoelectric sensing element includes a ring type piezoelectric device, two ceramic structural adhesives, two electrode sheets, two structural adhesives, a ring type sheet, and a disk-shaped cylindrical ceramic sheet. The two ceramic structural adhesives, respectively located above and below the ring type piezoelectric device. The two electrode sheets, respectively located above and below the two ceramic structural adhesives. The two structural adhesives, respectively located above and below the two electrode sheets. The ring type sheet, located above or below one of the two structural adhesives. The disk-shaped cylindrical ceramic sheet, located below or above another of the two structural adhesives.

14 Claims, 6 Drawing Sheets

(51) Int. Cl.
*H01L 41/187* (2006.01)
*G01L 1/16* (2006.01)
*G01P 15/09* (2006.01)

(56) References Cited

U.S. PATENT DOCUMENTS

| | | | |
|---|---|---|---|
| 6,362,559 B1 | 3/2002 | Boyd | |
| 7,309,450 B2 | 12/2007 | Nanao et al. | |
| 2004/0195941 A1* | 10/2004 | Ishimasa | G10K 9/122 310/348 |
| 2009/0015108 A1* | 1/2009 | Ishimasa | H04R 17/00 310/353 |
| 2009/0134744 A1* | 5/2009 | Yoon | H02N 1/163 310/323.06 |
| 2011/0239785 A1* | 10/2011 | Ting | H01L 41/1132 73/862.325 |

* cited by examiner

PIEZOELETRIC SENSING ELEMENT AND TORQUE SENSOR ASSEMBLED WITH THE SAME

CROSS REFERENCE TO RELATED APPLICATIONS

This application is a Divisional of co-pending application Ser. No. 13/078,507, filed on Apr. 1, 2011, and for which priority is claimed under 35 U.S.C. §120 and the entire contents of all of which are hereby incorporated by reference.

BACKGROUND OF THE INVENTION

1. Field of the Invention

The present invention relates to a method for processing a ring type piezoelectric device, which is applied in a piezoelectric sensor, wherein the piezoelectric sensor is applied in a torque sensor; more particularly, the present invention relates to a ring type piezoelectric device which is formed in one piece.

2. Description of the Related Art

The piezoelectric effect is a process of converting electrical energy into mechanical energy. This effect was first discovered in 1880 by the Curie brothers. In 1947, S. Roberts discovered the influence caused by a direct current electric field to BaTiO3 ceramic residual polarization, thereby triggering the applications and studies of ceramic materials in the aspect of piezoelectric effects. Nowadays, piezoelectric elements have been widely applied in various elements, such as sensors, actuators, transducers, and SAW filters. Because there are many types of piezoelectric elements, they can be classified as single layer or multi layer elements; according to their different structures, and rectangular, disk type or ring type (annular) elements, according to their different shapes.

The most important element of ring type piezoelectric elements is a ring type piezoelectric device. The manufacturing process of a conventional ring type piezoelectric device includes: respectively performing polarization of the same direction P1 to a plurality of square piezoelectric embryos 11a-14a; arranging the square piezoelectric embryos as shown in FIG. 1A; respectively processing the square piezoelectric embryos into fan-shaped piezoelectric embryos 11b-14b; and putting the fan-shaped piezoelectric embryos together as a ring shape, shown in FIG. 1B.

The polarization direction of the abovementioned conventional piezoelectric device does not surround an annular direction; that is, the polarization direction is not perpendicular to an annular cross sectional surface. Therefore, the potential disadvantages comprise: poor piezoelectric output, instability, and fragility of the structure.

Generally, a conventional torque sensor, composed of a plurality of small and rounded quartz piezoelectric materials arranged in an annular shape, cannot be formed in one piece. Therefore, the conventional torque sensor has a complex manufacturing process that is relatively lengthy.

Therefore, there a need to provide a ring type piezoelectric device, method for processing the same, and torque sensor assembled with the same to mitigate and/or obviate the aforementioned problems.

SUMMARY OF THE INVENTION

It is an object of the present invention to provide a method for processing a ring type piezoelectric device, wherein the ring type piezoelectric device is preferably formed in one piece.

It is another object of the present invention to provide a ring type piezoelectric device applied in a piezoelectric sensor, wherein the polarization direction of the ring type piezoelectric device is clockwise or counterclockwise perpendicular to the direction of an annular cross sectional surface.

It is yet another object of the present invention to provide a ring type piezoelectric device applied in a piezoelectric sensor, which is applied in a torque sensor.

To achieve the abovementioned objects, the present invention provides a method for processing a ring type piezoelectric device, comprising:

Step 1: providing a ring type piezoelectric embryo. Preferably, the ring type piezoelectric embryo is a lead zirconate titanate (PZT) piezoelectric embryo.

Step 2: printing at least a pair of electrode rings respectively on two sides of the ring type piezoelectric embryo so as to divide the ring type piezoelectric device into a plurality of equal sections. Preferably, the step of printing at least a pair of electrode rings substantially prints three pairs of electrode rings. The electrode ring is preferably a silver electrode ring.

Step 3: immersing the divided ring type piezoelectric embryo into high temperature silicon oil for performing high-voltage polarization to each section so as to make the polarization direction of the ring type piezoelectric device clockwise or counterclockwise perpendicular to the direction of an annular cross sectional surface.

Preferably, the present invention further performs a step of removing all electrode rings to form the ring type piezoelectric device. The ring type piezoelectric device thus formed meets a $d_{15}$ efficient piezoelectric coefficient.

Further, another object of the present invention is to provide a piezoelectric sensing element, which comprises a ring type piezoelectric device, two ceramic structural adhesives, two electrode sheets, two structural adhesives, a ring type ceramic sheet, and a disk-shaped cylindrical ceramic sheet. Preferably, the ring type piezoelectric device meets a $d_{15}$ effective piezoelectric coefficient.

For the piezoelectric sensing element of the present invention, two sides of the ring type piezoelectric device are respectively printed with a low-temperature electrode, wherein the polarization direction of the ring type piezoelectric device is clockwise or counterclockwise perpendicular to the direction of an annular cross sectional surface. The two ceramic structural adhesives are respectively located above and below the ring type piezoelectric device. The two electrode sheets are respectively located above and below the two ceramic structural adhesives, wherein the two electrode sheets can be adhered to the ring type piezoelectric device by pressurizing. The two structural adhesives are respectively located above and below the two electrode sheets, such that the two electrode sheets can be respectively adhered to the ring type ceramic sheet and the disk-shaped cylindrical ceramic sheet by means of the structural adhesives. Therefore, the ring type ceramic sheet is located above one of the two structural adhesives, while the disk-shaped cylindrical ceramic sheet is located below another of the two structural adhesives.

In another embodiment, the ring type ceramic sheet and the disk-shaped cylindrical ceramic sheet can be replaced with a ring type material sheet with a high friction coefficient and a disk-shaped cylindrical material sheet with a high friction coefficient.

Further, yet another object of the present invention is to provide a ring type piezoelectric device applied in a piezoelectric sensor, which is applied in a torque sensor. The torque sensor comprises: a piezoelectric sensing element, a deformation structural element, and a fixing element. The piezoelectric sensing element is the piezoelectric sensing element according to the abovementioned description. The deformation structural element is disposed within the deformation structural element and used for receiving a force applied by a torque test object.

The fixing element comprises a through hole. The through hole is capable of accommodating the torque test object, such that the torque test object can contact the deformation structural element. The deformation structural element can equivalently transfer the received force to the piezoelectric sensing element, and generate an output signal according to the direct piezoelectric effect of the piezoelectric sensing element.

The fixing element, the deformation structural element, and the piezoelectric sensing element are mounted together by means of a second structural adhesive or a screw bolt.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1A:
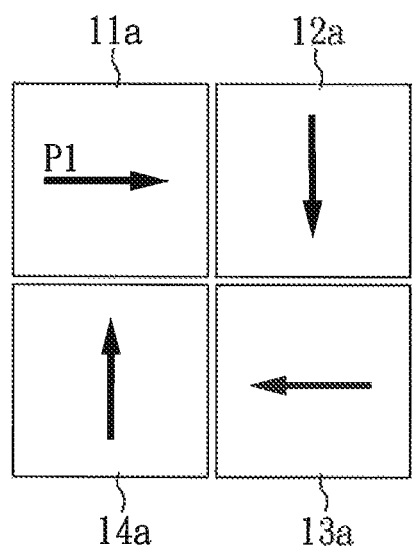
FIG. 1A and FIG. 1B illustrate processes of manufacturing a conventional ring type piezoelectric device.
Figure 1B:
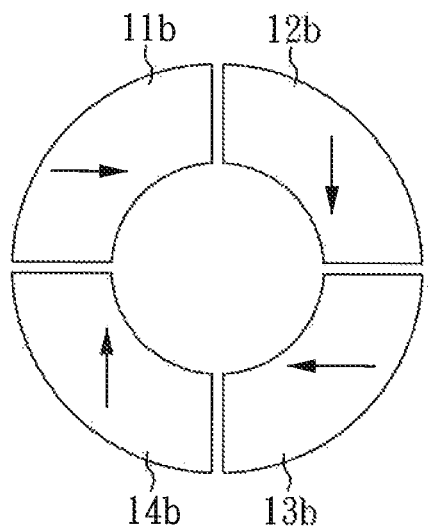
Figure 2A:
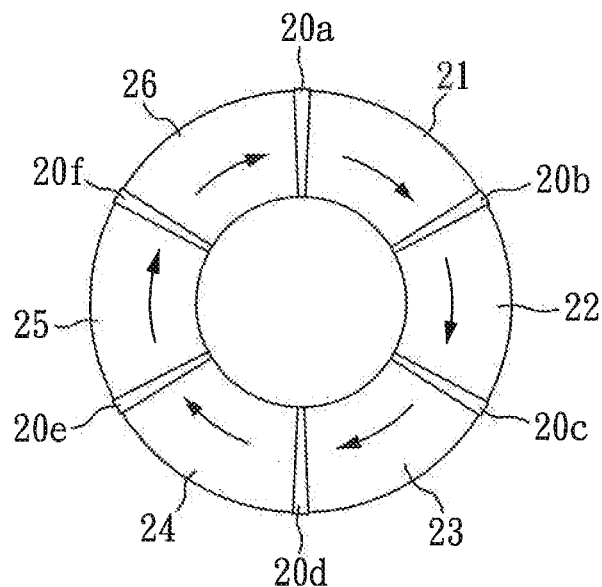
FIG. 2A and FIG. 2B illustrate processes of manufacturing a ring type piezoelectric device according to the present invention.
Figure 2B:
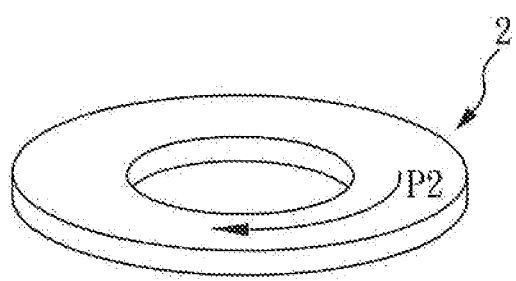

Please refer to both FIG. 2A and FIG. 2B, which illustrate processes of manufacturing a ring type piezoelectric device 2 according to the present invention. The processes comprise the following steps:

Firstly, step 1: providing a ring type piezoelectric embryo. Preferably, the ring type piezoelectric embryo is a lead zirconate titanate (PZT) piezoelectric embryo. Because the piezoelectric embryo is well known to those who skilled in the art, there is no need for further description.

Next, step 2: printing at least a pair of electrode rings 20a-20f respectively on two sides of the ring type piezoelectric embryo, so as to divide the ring type piezoelectric device into a plurality of equal sections. Preferably, the electrode ring is a silver electrode ring. The step of printing at least a pair of electrode rings substantially prints three pairs of electrode rings. Therefore, the ring type piezoelectric device is divided into six equal sections 21-26.

Then step 3: immersing the divided ring type piezoelectric embryo into high temperature silicon oil for performing high-voltage polarization to each section, so as to make the polarization direction of the ring type piezoelectric device clockwise or counterclockwise perpendicular to the direction of an annular cross sectional surface.

For example, the electrode ring 20a is set as "+" voltage, and the electrode ring 20b is set as "−" voltage. As a result, when the present invention performs high-voltage polarization to the ring type piezoelectric embryo, the polarization direction of the section 21 of the ring type piezoelectric embryo can correspond to the arrow direction, as shown in FIG. 2A. For example, the high-voltage polarization applies a direct current polarization voltage of more than one thousand V/mm, preferably 1.5 KV/mm as a minimum, to an equivalent mid-diameter between the electrodes of the piezoelectric embryo. Then the electrode ring 20b is changed to "+" voltage, and the electrode ring 20c is set as "−" voltage for the high-voltage polarization, such that the polarization direction of the section 22 of the ring type piezoelectric embryo can correspond to the arrow direction shown in FIG. 2A. The present invention sequentially performs the high-voltage polarization to complete the high-voltage polarization to all sections 21-26 of the piezoelectric embryo, thereby obtaining the polarization direction shown in FIG. 2A.

Further, in order to reduce the time required for polarization, the present invention can set the electrode rings 20a and 20d as "+" voltage, and the electrode rings 20b and 20e as "−" voltage for the high-voltage polarization, such that the polarization direction of the sections 21 and 24 of the ring type piezoelectric embryo can correspond to the arrow directions shown in FIG. 2A. Therefore, only three times of polarization are required to complete the polarization to the entire ring type piezoelectric embryo.

Although three pairs of electrode rings are depicted in the figures, please note that the number of electrode rings is not limited to the above description. For example, four pairs of electrode rings can also achieve the objects of the present invention, which means that the polarization direction of the ring type piezoelectric device is clockwise or counterclockwise perpendicular to the direction of an annular cross sectional surface.

Preferably, after the polarization, the present invention further performs a step of removing all electrode rings 20a-20f, so as to form a required ring type piezoelectric device 2. As shown in FIG. 2B, the ring type piezoelectric device 2 is formed in one piece, and its polarization direction P2 is clockwise or counterclockwise perpendicular to the direction of the annular cross sectional surface. Preferably, the ring type piezoelectric device formed according to the method of the present invention meets a $d_{15}$ effective piezoelectric coefficient.

Further, another object of the present invention is to provide a piezoelectric sensing element. Please refer to FIG. 3 and FIG. 4. FIG. 4 illustrates a perspective view of an assembled piezoelectric sensing element 4 according to FIG. 3. The piezoelectric sensing element 4 of the present invention comprises a ring type piezoelectric device 2, two ceramic structural adhesives 31, two electrode sheets 33, two structural adhesives 34, a ring type ceramic sheet 35, and a disk-shaped cylindrical ceramic sheet 36. Preferably, the ring type piezoelectric device 2 meets a $d_{15}$ effective piezoelectric coefficient.

For the piezoelectric sensing element 4 of the present invention, two sides of the ring type piezoelectric device 2 are respectively printed with a low-temperature electrode (not shown in figures). For example, two sides of the ring type piezoelectric device 2 can be coated with low-temperature silver pastes as the low-temperature electrodes. The polarization direction of the ring type piezoelectric device 2 is clockwise or counterclockwise perpendicular to the annular cross sectional direction. Precisely, the ring type piezoelectric device 2 can be formed by means of utilizing the above mentioned method.

Figure 3:
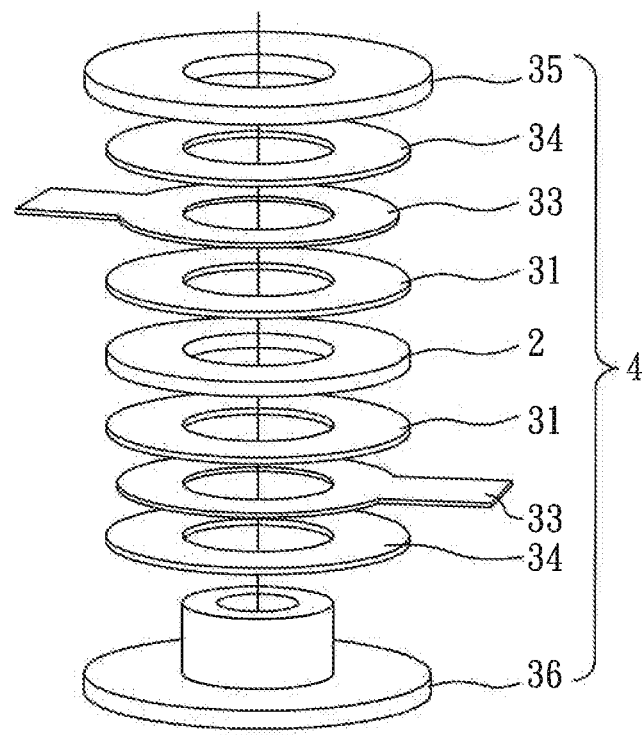
FIG. 3 illustrates an exploded view of a piezoelectric sensing element according to the present invention.
Figure 4:
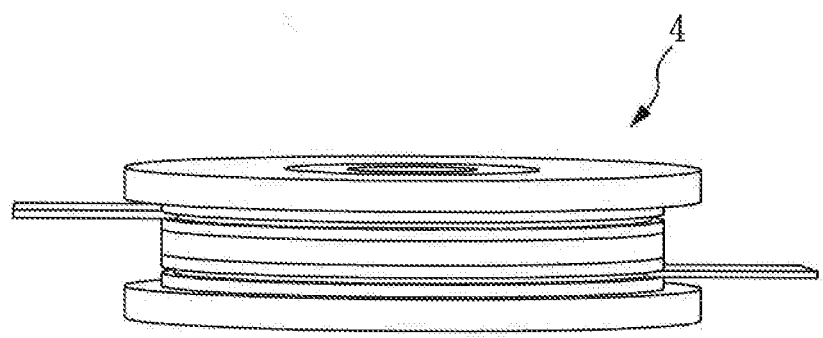
FIG. 4 illustrates a perspective view of the piezoelectric sensing element according to FIG. 3 of the present invention.

As shown in FIG. 3, the two ceramic structural adhesives 31 and 31 are respectively located above and below the ring type piezoelectric device 2. The two electrode sheets 33 and 33 are respectively located above and below the two ceramic structural adhesives 31 and 31, wherein the two electrode sheets 33 and 33 can be adhered to the ring type piezoelectric device 2 by pressurizing the two ceramic structural adhesives 31 and 31. The two structural adhesives 34 and 34 are respectively located above and below the two electrode sheets 33 and 33, such that the two electrode sheets 33 and 33 can be respectively adhered to the ring type ceramic sheet 35 and the disk-shaped cylindrical ceramic sheet 36 by means of the structural adhesives 34 and 34. Therefore, the ring type ceramic sheet 35 is located above one of the two structural adhesives 34, while the disk-shaped cylindrical ceramic sheet 36 is located below another of the two structural adhesives 34.

In another embodiment of the present invention, the ring type ceramic sheet 35 and the disk-shaped cylindrical ceramic sheet 36 can also be replaced with a ring type material sheet with a high friction coefficient and a disk-shaped cylindrical material sheet with a high friction coefficient.

Either the ceramic sheet or the material sheet with a high friction coefficient is a multi-layer piezoelectric element, which is well known to those who skilled in the art; therefore, there is no need to describe the theory and function of the multi-layer structure in more detail. The piezoelectric sensing element 4 of the present invention utilizes the ring type piezoelectric device 2 formed in one piece, so as to simplify the manufacturing process and reduce the manufacturing time. Moreover, because the polarization direction of the ring type piezoelectric device 2 is clockwise or counterclockwise perpendicular to the annular cross sectional surface, the present invention further comprises the advantages of: improved piezoelectric output efficiency, high stability, and better structural strength.

Figure 5A:
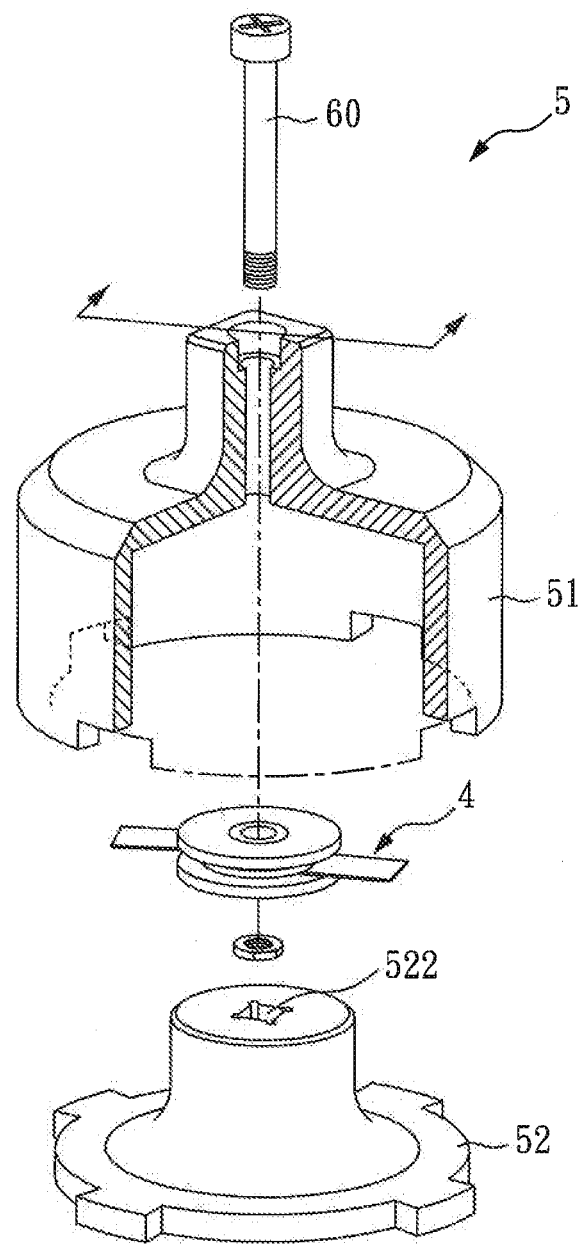
FIG. 5A illustrates an exploded view of a torque sensor according to one embodiment of the present invention.
Figure 5B:
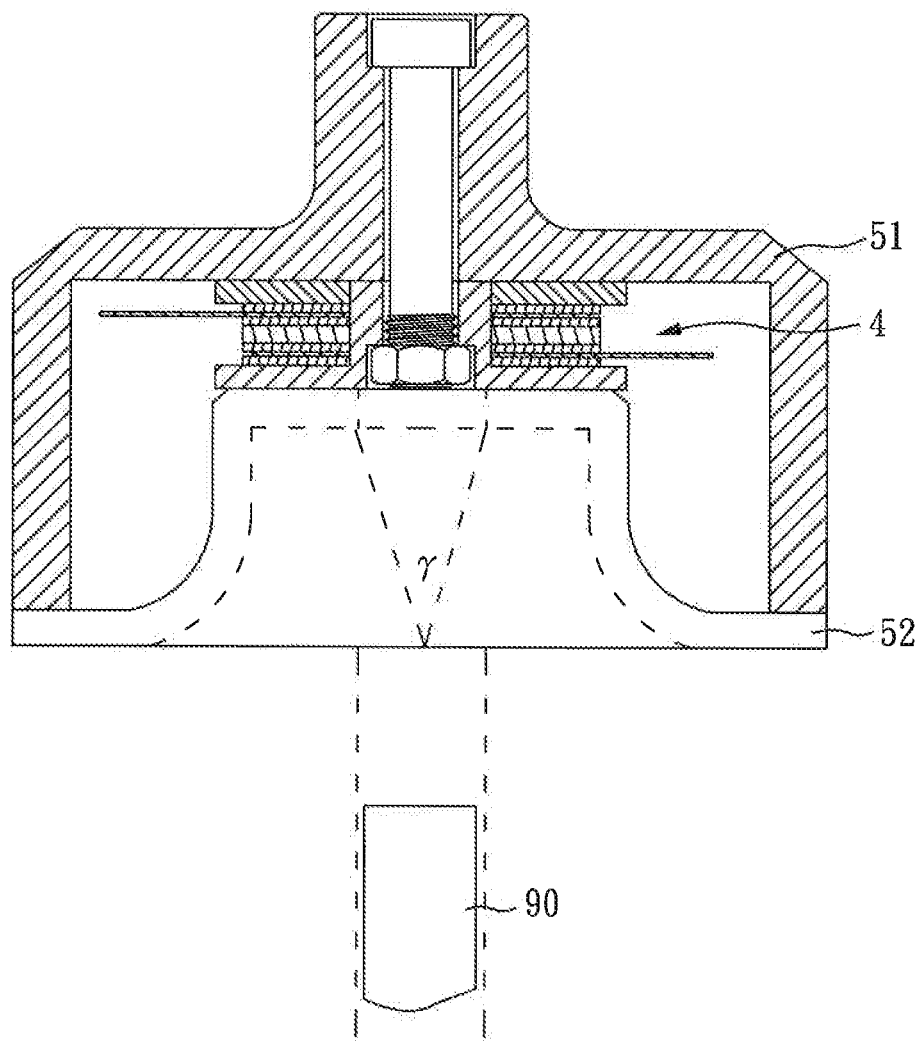
FIG. 5B illustrates a cross sectional view showing the torque sensor of FIG. 5A being assembled.

Further, yet another object of the present invention is to provide a torque sensor. As shown in FIG. 5A and FIG. 5B, the torque sensor 5 comprises: a piezoelectric sensing element 4, a deformation structural element 51, and a fixing element 52. The piezoelectric sensing element 4 is the piezoelectric sensing element 4, as shown in the above FIG. 4. The piezoelectric sensing element 4 is disposed within the deformation structural element 51 and is used for receiving a force applied by a torque test object 90.

The fixing element 52 comprises a through hole 522. The fixing element 52 is corresponding to the deformation structural element 51 so as to sandwich the piezoelectric sensing element 4 between the fixing element 52 and the deformation structural element 51. The through hole 522 is capable of accommodating the torque test object 90, such that the torque test object 90 can contact the deformation structural element 51.

If the piezoelectric sensing element 4 adopts the aforementioned ring type ceramic sheet 35 and the aforementioned disk-shaped cylindrical ceramic sheet 36, the torque sensor 5 can utilize a second structural adhesive (not shown in figures) to respectively adhere two sides (i.e. outers of the ring type ceramic sheet 35 and the disk-shaped cylindrical ceramic sheet 36) of the piezoelectric sensing element 4 to the fixing element 52 and the deformation structural element 51.

In another embodiment, a screw bolt 60 (such as a coaxial screw bolt) can be utilized to mount the piezoelectric sensing element 4 and the deformation structural element 51 to the fixing element 52.

Please refer to FIG. 5B, which illustrates a cross-section view showing partial assembly of the torque sensor according to the present invention to explain the test of the torque sensor. When the torque test object 90 contacts the deformation structural element 51 and starts to twist along the arrow direction, the torque of the torque test object 90 is applied to the deformation structural element 51 to generate deformation $\gamma$ according to a basic equation: $\tau = G * \gamma$. Because the piezoelectric sensing element 4 is mounted to the deformation structural element 51, the deformation $\gamma$ will be equivalently transferred to the piezoelectric sensing element 4, thereby generating an output signal according to the direct piezoelectric effect.

Take a "pneumatic wrench" as an example. Because it has a greater impact, it is necessary to reduce the torque. An appropriate shear modulus (modulus of rigidity, G) of the material of the deformation structural element 51 can be selected according to the strength of the applied torque under test. The (inner/outer) diameter and thickness of the piezoelectric sensing element 4 can be designed according to relevant sizes of the torque test object. However, the effectiveness of the manufacturing process, such as polarization, must be maintained during the manufacture of the piezoelectric sensing element. During the process of designing the torque sensor, the maximal circumference ID deformation of the piezoelectric sensing element 4 or 4° should be greater than the deformation $\gamma$. Therefore, the range of measuring the torque and the connection interface of the torque test object can be determined according to the material natures and sizes of different deformation structural elements. As a result, different designs can be implemented according to different measuring methods, conditions and requirements. Therefore, the abovementioned "pneumatic wrench" may not limit the scope of the present invention.

Figure 6:
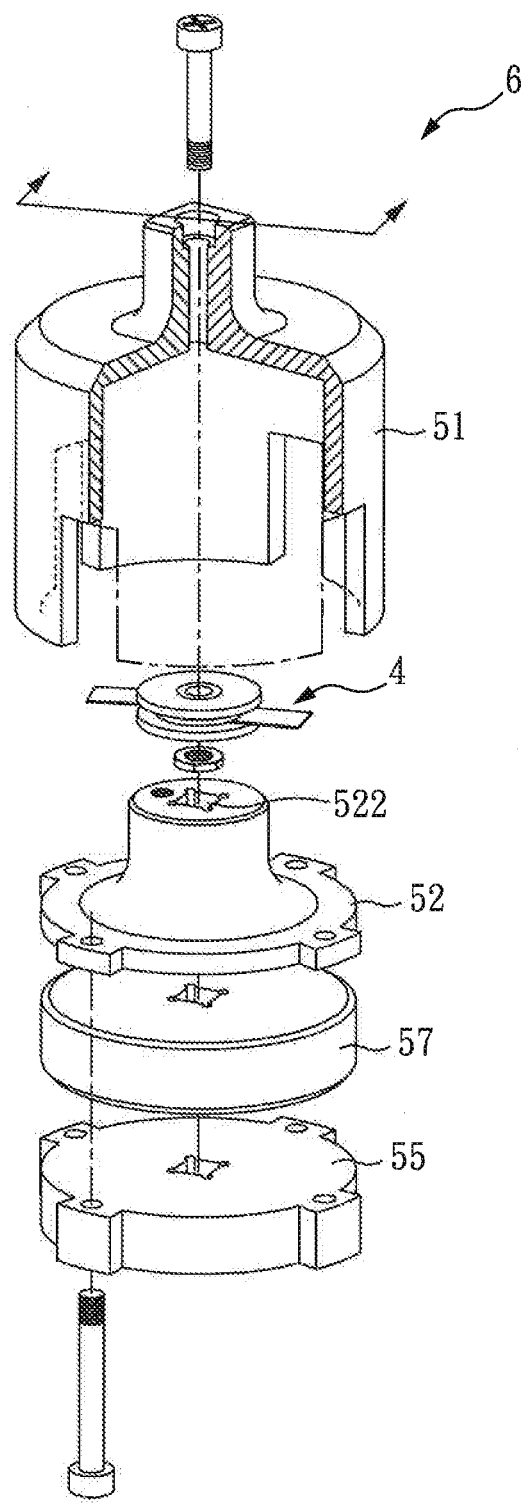
FIG. 6 illustrates an exploded view of the torque sensor according to another embodiment of the present invention.

FIG. 6 shows another embodiment of the present invention. The torque sensor 6 further comprises a wireless communication device 57 and a base 55 for fixing the wireless communication device 57. In this embodiment, the measurement can be sent by the wireless communication device 57.

Although the present invention has been explained in relation to its preferred embodiments, it is to be understood that many other possible modifications and variations can be made without departing from the spirit and scope of the invention as hereinafter claimed.

What is claimed is:

1. A piezoelectric sensing element, comprising:
    a ring type piezoelectric device, with two sides respectively printed with a low-temperature electrode, wherein the polarization direction of the ring type piezoelectric device is clockwise or counterclockwise perpendicular to the direction of an annular cross sectional surface;
    two ceramic structural adhesives, respectively located above and below the ring type piezoelectric device;
    two electrode sheets, respectively located above and below the two ceramic structural adhesives, wherein the two electrode sheets can be adhered to the ring type piezoelectric device by pressurizing the two ceramic structural adhesives;
    two structural adhesives, respectively located above and below the two electrode sheets;
    a ring type sheet, located above or below one of the two structural adhesives; and a disk-shaped cylindrical ceramic sheet, located below or above another of the two structural adhesives.

2. The piezoelectric sensing element as claimed in claim 1, wherein the ring type sheet is a ring type ceramic sheet.

3. The piezoelectric sensing element as claimed in claim 2, wherein the disk-shaped sheet is a disk-shaped cylindrical ceramic sheet.

4. The piezoelectric sensing element as claimed in claim 1, wherein the ring type sheet is a ring type material sheet with a high friction coefficient.

5. The piezoelectric sensing element as claimed in claim 4, wherein the disk-shaped sheet is a disk-shaped cylindrical material sheet with a high friction coefficient.

6. The piezoelectric sensing element as claimed in claim 1, wherein the ring type piezoelectric device meets a $d_{15}$ effective piezoelectric coefficient, and the ring type piezoelectric device is formed in one piece.

7. A torque sensor comprising: a piezoelectric sensing element as claimed in claim 6;
a deformation structural element for receiving a force applied by a torque test object, wherein the piezoelectric sensing element is disposed within the deformation structural element; and
a fixing element comprising a through hole, wherein the fixing element is corresponding to the deformation structural element so as to sandwich the piezoelectric sensing element therebetween, and the through hole is capable of accommodating the torque test object, such that the torque test object contact the deformation structural element through the piezoelectric sensing element.

8. The torque sensor as claimed in claim 7, wherein the ring type sheet is a ring type ceramic sheet.

9. The torque sensor as claimed in claim 8, wherein the disk-shaped sheet is a disk-shaped cylindrical ceramic sheet.

10. The torque sensor as claimed in claim 7, wherein the ring type sheet is a ring type material sheet with a high friction coefficient.

11. The torque sensor as claimed in claim 10, wherein the disk-shaped sheet is a disk-shaped cylindrical material sheet with a high friction coefficient.

12. The torque sensor as claimed in claim 7, wherein the ring type piezoelectric device meets a $d_{15}$ effective piezoelectric coefficient, and the ring type piezoelectric device is formed in one piece.

13. The torque sensor as claimed in claim 7 further comprising a wireless communication device and a base for fixing the wireless communication device.

14. The torque sensor as claimed in claim 7, wherein the fixing element, the deformation structural element, and the piezoelectric sensing element are mounted together by means of a second structural adhesive or a screw bolt.

* * * * *